United States Patent [19]

Skinner

[11] 3,908,155

[45] Sept. 23, 1975

[54] WAFER CIRCUIT PACKAGE

[75] Inventor: Dean W. Skinner, Binghamton, N.Y.

[73] Assignee: International Business Machines Corporation, Armonk, N.Y.

[22] Filed: Apr. 19, 1974

[21] Appl. No.: 462,463

[52] U.S. Cl. .............................. 317/100; 317/101 D

[51] Int. Cl.[2] .............................................. H02B 1/00

[58] Field of Search ..... 317/101 D, 101 DH, 101 R, 317/100; 339/17 C, 17 CF, 17 LM, 17 M

[56] References Cited

UNITED STATES PATENTS

| | | | |
|---|---|---|---|
| 3,596,140 | 7/1971 | Walsh | 317/101 DH |
| 3,648,115 | 3/1972 | Teagno | 317/101 DH |

FOREIGN PATENTS OR APPLICATIONS

| | | | |
|---|---|---|---|
| 1,150,721 | 6/1963 | Germany | 317/101 D |

*Primary Examiner*—David Smith, Jr.
*Attorney, Agent, or Firm*—Charles S. Neave

[57] ABSTRACT

A wafer type circuit package particularly designed for memory applications comprises a plurality of silicon wafer circuit devices disposed as an aligned stack and supported in spaced apart relationship by a plurality of electrical interconnection busses. The interconnection busses are adapted for edge connecting with electrical surfaces on the silicon wafers and with terminal contacts arranged in a base member. The terminal contacts extend through the base member and accommodate external electrical connections with other logic circuitry. A container encapsulates the wafer assembly and is hermetically sealed to the base member to retain coolant therein.

2 Claims, 3 Drawing Figures

WAFER CIRCUIT PACKAGE

BACKGROUND OF THE INVENTION

1. Field of the Invention

This invention relates to an improved circuit packaging arrangement and, more particularly, to the packaging arrangement for an assembly of wafer circuits adapted for memory applications in a data processing system.

2. Description of the Prior Art

The integrated circuit packaging art is a well developed one. In the packaging of integrated circuits for complex electronic equipment such as data processing systems, the dominant approach to data has been to contain memory circuits and logic circuits in separate first level packages for a variety of reasons, including the fact that memory circuits tend to be of substantially greater density than logic circuits, but require a substantially lower number of inputs or outputs from or to the package. Another difference between logic circuits and memory circuits which is important from a packaging standpoint is that logic circuits tend to be faster than memory circuits in their operation. An example of such a prior art first level package is contained in an article by Mandel et al., entitled "Heat Dissipator Assemblies" in the IBM Technical Disclosure Bulletin, Volume 8, No. 10, March 1966, pages 1,460 and 1,461. First level packages suitable for containing a large quantity of integrated circuits are also known in the art and disclosed, for example, in U.S. Pat. No. 3,529,213 to W. A. Farrand et al. Another example of a packaging structure providing for a multiplicity of hermetically sealed modules for integrated circuit chips and incorporating cooling is disclosed in the U.S. Pat. No. 3,706,010 to L. Laermer et al.

The use of liquid cooling for dissipating heat generated by the operation of integrated circuits is also known, as disclosed in the commonly assigned U.S. Pat. No. 3,537,063 to P. E. Beaulieu.

As integrated circuit operating speeds and densities increase, and as data processing system technology becomes more and more sophisticated, more stringent requirements are imposed for integrated circuit packaging. Thus, while the integrated circuit packaging art is a well developed one, further improvement in packaging technology is constantly required to keep pace with the technology of the integrated circuits themselves.

Alternative approaches to the same problems are described in a patent application, Ser. No. 462,461, by A. A. Rifkin et al. entitled "An Electronic Assembly for Wafer Circuit Elements" and a patent application, Ser. No. 462,462, by W. B. Archey et al. entitled "A Liquid Encapsulated Integrated Circuit Package", both assigned to the assignee of this application and filed on even date herewith.

SUMMARY OF THE INVENTION

In accordance with the invention there is provided a packaging assembly for wafer-type silicon circuit devices adapted as a memory package for association with a high speed data processing system. The packaging assembly comprises a flat base member, a plurality of terminal contacts arranged in a circular array on the base member and adapted for connection with external circuits, a plurality of silicon circuit devices disposed as an aligned stack with a plurality of tunning-fork type buss connectors adapted for edge connecting with electrical surfaces on the silicon wafers and supporting the wafers in spaced apart relationship. The buss connectors are adapted for connection through the base member and with other external circuit logic. A container hermetically sealed to the base member is utilized for retaining cooling fluid therein.

Accordingly, it is an object of this invention to provide an improved packaging assembly for wafer type circuit devices.

It is another object of this invention to provide a packaging assembly of silicon wafer circuit devices particularly adapted as a memory package for association with a data processing system.

It is a still further object of the invention to provide a package of stacked integrated circuit wafer devices which are high density, have high input or output capability, and in which rework of the stack may be conveniently carried out.

The foregoing and other objects, features and advantages of the invention will be apparent from the following more particular description of a preferred embodiment of the invention, as illustrated in the accompanying drawings.

DESCRIPTION OF THE PREFERRED EMBODIMENT

Figure 1:
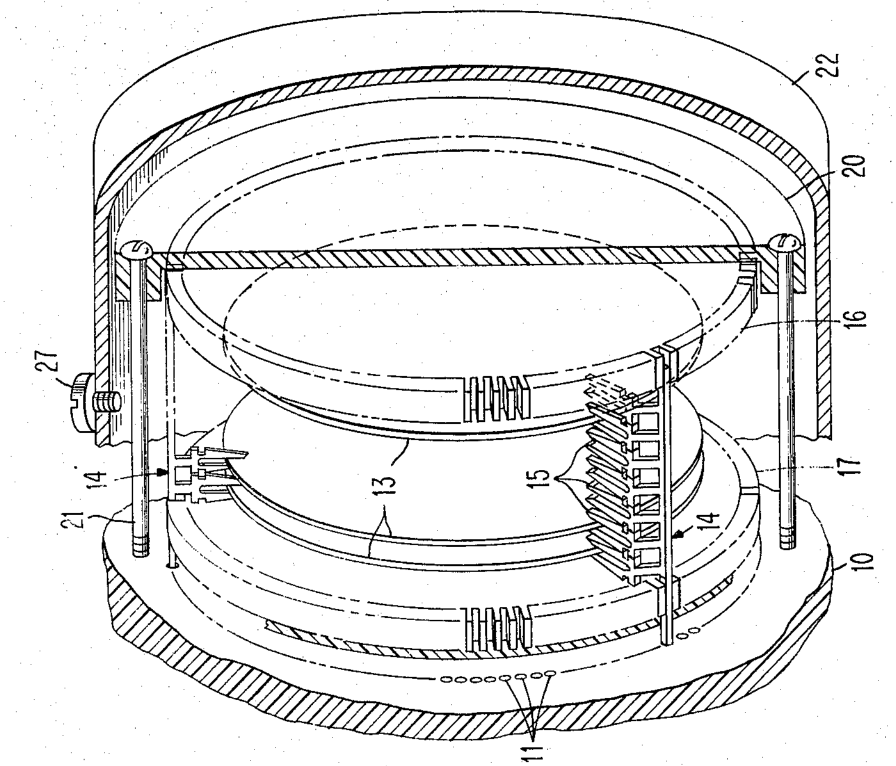
FIG. 1 is a fragmentary isometric showing of a wafer circuit package adapted for application as a memory device in accordance with the present invention.
Figure 3:
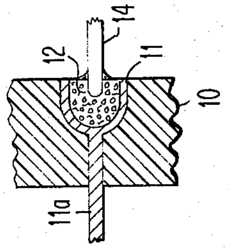
FIG. 3 is an enlarged showing of one of the solder cups located in the base member of the packaging assembly.
Figure 2:
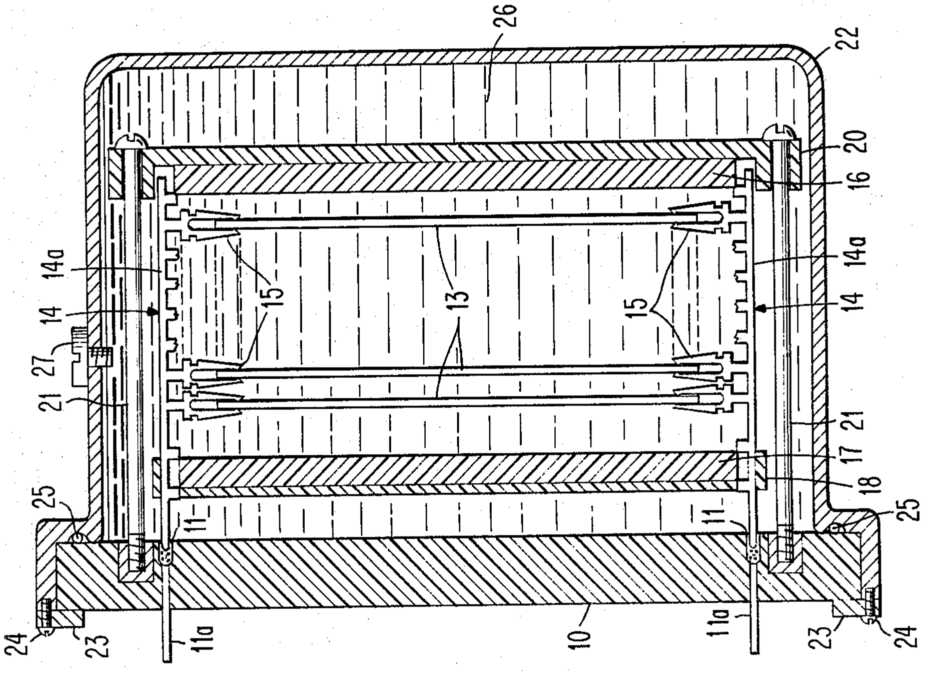
FIG. 2 is an elevational view of the wafer packaging assembly.

In FIGS. 1 and 2 there is shown a memory circuit wafer package assembly optimizing the stackable packaging of a plurality of memory wafers. The assembly provides an improved packaging arrangement particularly suited for silicon wafer circuit layers which are readily usable as memory storage devices in a data processing system.

The packaging structure comprises a base member 10 formed, for example, of epoxy glass or ceramic material. The base member 10 contains a plurality of solder cups 11 arranged in a circular array and including pin portions 11*a* that extend through and protrude from the bottom of the base member 10. The solder cups 11 are filled with solder material 12, preferably a low melt solder. The pins 11*a* protruding from the bottom of the base member 10 are adapted to make electrical connection with external logic circuity.

A plurality of circular silicon semiconductor wafers 13 are arranged as an aligned stack and supported in space apart relationship by a multiple of electrical interconnection busses 14. Various integrated circuits are formed on the silicon wafers 13. The interconnection busses 14 comprise a series of low contact force tunning-fork type connectors 15 attached to a selvage strip 14*a.* The low contact force tunning-fork connectors 15 are preferable in order to prevent damage to the silicon wafers when making electrical connection thereto.

The assembly further includes a circular upper buss guide 16 and lower buss guide 17 having a serrated peripheral edge designed to hold the interconnection busses 14 in spaced apart arrangement. A collar member 18 is employed at the bottom of the stacked array and functions to further retain and align the electrical interconnection busses 14 and give some rigidity to the wafer assembly. After the buss guides 16 and 17 and collar member 18 are placed in position, the stacked array is located over the base member 10 with the lower ends of the electrical interconnection busses 14 in contact with the solder 12 in the solder cups 11. The solder 12 is reflowed by an application of heat to effect the joining of the stack assembly with the solder cups 11. The buss guides 16 and 17 and collar member 18 are preferably fabricated of a material having a coefficient of thermal expansion which closely matches that of the silicon wafers 13. For example, KOVAR (trademark of Westinghouse Electric Corporation) with an insulative coating or glass can be used.

The wafer assembly is further secured in place and to the base member 10 by means of a retainer cap 20 fastened to the base member 10 with two or more bolts 21.

A coolant container 22 encloses the entire wafer assembly and is attached to the base member 10 by a clamp ring 23 which is held in place by the screws 24. The coolant container 22 is sealed to the base member 10 by use of an O ring 25 which functions to provide a positive seal. The coolant container 22 is filled with a coolant liquid 26 through the filler cap 27.

From the above description and the accompanying drawings, it will be apparent that the present invention provides an improved packaging assembly of memory wafers in multiples and in such a way as to allow for adequate cooling, ease of assembly, and rework. Some of the salient features are the utilization of the low force separable connections to the silicon wafer elements, a means of stacking a multiple of wafers utilizing common busses, and the utilization of thin busses which permit a free flow of coolant liquid over the wafer surfaces.

While the invention has been particularly shown and described with reference to a preferred embodiment thereof, it will be understood by those skilled in the art that various changes in form and details may be made therein without departing from the spirit and scope of the invention.

What I claim is:

1. A packaging assembly for wafer-type circuit devices comprising:

a. a flat base member fabricated of epoxy glass material, b. a plurality of terminal contacts arranged in a circular array in said base member and adapted for connection with external circuit means, c. a plurality of silicon circuit devices disposed as an aligned stack, d. a plurality of wafer electrical interconnection busses mounted in the terminal contacts in said base member and each including a plurality of tuning-fork type connectors adapted for edge connecting with electrical surfaces on the silicon wafers and supporting the silicon wafers in spaced apart relationship, e. a container encapsulating the wafer assembly and hermetically sealed to the base member and adapted to retain cooling fluid therein and provided with a cap in said container for introducing cooling fluid into the container, and f. an upper and a lower buss guide member having a serrated peripheral edge designed to hold the interconnection busses in spaced apart arrangement.

2. A packaging assembly for wafer-type circuit devices as defined in claim 1 and further including an assembly retainer cap member attached to the base member by bolt means and functioning to secure the assembly to the base member.

* * * * *